United States Patent
Ho et al.

[11] Patent Number: 5,981,386
[45] Date of Patent: Nov. 9, 1999

[54] METHOD FOR MANUFACTURING INTERCONNECTION PLUG

[75] Inventors: Ching-Yuan Ho; Shang-Yun Hou, both of Hsinchu, Taiwan

[73] Assignee: Worldwide Semiconductor Manufacturing Corp., Hsinchu, Taiwan

[21] Appl. No.: 08/999,235

[22] Filed: Dec. 29, 1997

[30] Foreign Application Priority Data

Oct. 17, 1997 [TW] Taiwan .................................. 86115291

[51] Int. Cl.$^6$ ..................................................... H01L 21/44
[52] U.S. Cl. ............................ 438/672; 438/628; 438/629
[58] Field of Search .............................. 438/6, 626–645, 438/666–675

[56] References Cited

U.S. PATENT DOCUMENTS 4,879,257 11/1989 Patrick .
5,827,777 10/1998 Schinella et al. .

*Primary Examiner*—Jey Tsai
*Attorney, Agent, or Firm*—Rabin & Champagne, P.C.

[57] ABSTRACT

A method for forming interconnection plugs comprising the steps of providing a substrate, then forming a dielectric layer having an opening that exposes a pad area for connection with other structures. Next, a glue layer is formed lining the opening and the dielectric layer. Subsequently, plug material is deposited into the opening to form a plug layer. This is followed by etching back the plug layer to a level higher than the glue layer that formed on the top of the dielectric layer. Thereafter, a metallic layer is formed over the plug layer, and a photoresist layer is then coated over the metallic layer. The metallic layer and the plug layer are then patterned by etching such that the plug layer is turned a plug. The characteristic of this invention lies in retaining a portion of the plug layer after the first etching such that the etched plug layer is at a level higher than the glue layer. Through combining the patterning of the metallic layer and the plug layer, one etching step is saved, moreover, recess formation can be prevented, thereby leading to no deterioration of electrical properties or lowering of the yield in the semiconductor devices.

19 Claims, 4 Drawing Sheets

METHOD FOR MANUFACTURING INTERCONNECTION PLUG

BACKGROUND OF THE INVENTION

1. Field of Invention

The present invention relates to a method for manufacturing semiconductor devices. More particularly, the present invention relates to a method for manufacturing interconnection plugs.

2. Description of Related Art

Tungsten plug is now extensively used for interconnecting multiple layers in very large scale integration (VLSI). At present, how to control the formation of recesses in a tungsten etch-back operation is a major issue. To prevent short-circuiting current in the device caused by residual tungsten hanging onto the surface of a wafer, over-etching is often carried out during the tungsten etch-back operation. However, the longer the etching time is, the worse will be the phenomenon of recess formation on the surface of a tungsten plug. When the semiconductor demands a stack structure with a multiple of layers, the problem of recess formation will become worse. Recesses on the surface of the tungsten plug will lead either to a deterioration of the electrical properties of a semiconductor device or a low yield. Although the conventional chemical-mechanical polishing (CMP) method can reduce such recess formation, the machinery for carrying out the CMP operation are expensive and will increase the cost of production.

FIGS. 1A through 1D are cross-sectional views showing the progression of manufacturing steps in the production of a plug according to a conventional method. First, as shown in FIG. 1A, a substrate 10 is provided. This substrate 10, for example, has a bottom metallic layer 12, which are designed for connecting with structures in other areas. Then, a chemical vapor deposition (CVD) method is used to form a dielectric layer 14 over the substrate. Next, conventional photolithographic and etching processes are used to pattern the dielectric layer 14 forming an opening 16 that exposes the bottom metallic layer 12.

Next, as shown in FIG. 1B, a glue layer 18 is formed over the bottom metallic layer 12 of the opening 16, the dielectric sidewalls of the opening 16, and the dielectric layer 14 itself. The glue layer serves to increase the adhesive strength of subsequently deposited plug material, as well as to act as an etching stop layer. The glue layer 18 can be a titanium/titanium nitride (Ti/TiN) composite layer, for example. The method of forming the glue layer 18 includes depositing a titanium layer over the bottom metallic layer 12, the dielectric sidewalls of the opening 16 and the dielectric layer 14, then performing a nitriding reaction, a chemical vapor deposition method, a IMP method or a reactive sputtering method to deposit a layer of titanium nitride layer over the titanium layer. In a subsequent step, a chemical vapor deposition method is used to deposit plug material 20 over the glue layer 18 above the dielectric layer 14 and the glue layer 18 above the opening 16. The plug material 20, for example, can be tungsten or aluminum.

Next, as shown in FIG. 1C, using an anisotropic dry etching method or a chemical-mechanical polishing (CMP) method, the plug material 20 is etched back removing the whole top layer of the plug material 20 and exposing the dielectric layer 14 so that a plug is formed with the remaining plug material. However, one of the defects in this conventional plug production method is the formation of recesses 22 on the plug surface.

Next, as shown in FIG. 1D, subsequent processes are performed. For example, a metallic layer 24 is deposited over the plug, and a stack structure that includes bottom metallic layer 12/plug/metallic layer 24 is formed. Because the plug surface has a recess, the metallic layer 24 also has a recess 26. When a multiple of these stacks are required in the semiconductor, the problem of recess formation will be amplified. Furthermore, in subsequent steps, when another layer of dielectric is deposited over this metallic layer 24, residual dielectric material that resides in the recess is difficult to remove, thereby leading to a deterioration of electrical properties or a lower yield.

In light of the foregoing, there is a need in the art to provide a better method for manufacturing interconnection plug.

SUMMARY OF THE INVENTION

Accordingly, the present invention is directed to a method for forming interconnection plugs that is free from recesses. Thus, deterioration of the electrical properties or lowering of the yield can be prevented.

To achieve these and other advantages and in accordance with the purpose of the invention, as embodied and broadly described herein, the invention provides a method for forming plugs comprising the steps of providing a substrate having a dielectric layer formed thereon, wherein an opening exposing a pad area for connection with other structures is also formed in the dielectric layer. Next, a glue layer is formed over the pad area, the dielectric sidewalls of the opening and the dielectric layer. Subsequently, plug material is deposited into the opening forming a plug layer. This is followed by etching back the plug layer to a level higher than the glue layer that lies above the dielectric.

Then, a metallic layer is formed over the etched plug layer. Next, a photoresist layer is formed over the metallic layer above the opening area while exposing other specified regions of the metallic layer. Later, the exposed metallic layer and the plug layer above the dielectric is etched until the dielectric layer is exposed, thus shaping the plug layer into a plug.

The first characteristic of this invention is the retaining of a portion of the plug layer after etching. Hence, the etched plug is still above the glue layer that formed on top of the dielectric layer by about 200 Å to 500 Å. Consequently, the formation of recesses on plug surface can be prevented, and there is no deterioration of electrical properties or a lowering of yield for the devices.

The second characteristic of this invention is the etching of the metallic layer and the plug layer to form the plug in the same etching operation using the same patterned photoresist layer. This saves an extra processing step.

The third characteristic is that no expensive chemical-mechanical polishing machinery is used. Therefore, the method of this invention is cost effective.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
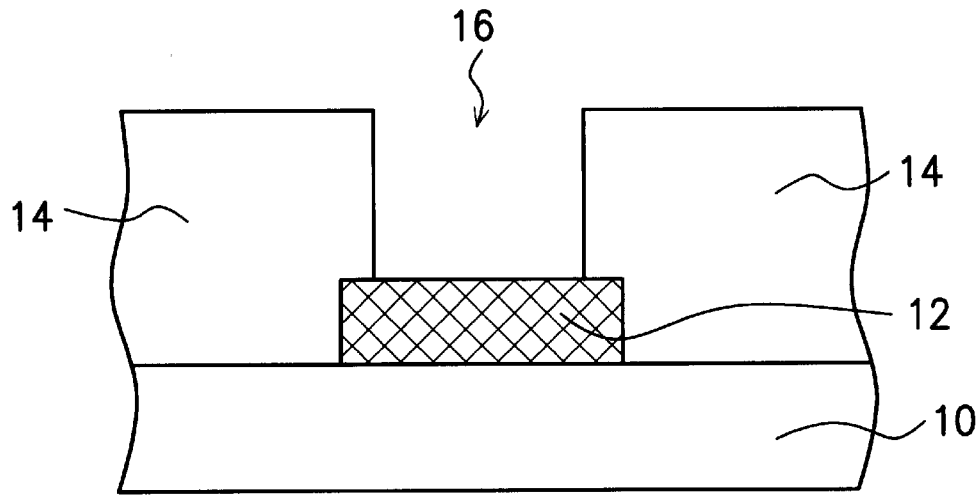
FIGS. 1A through 1D are cross-sectional views showing the progression of manufacturing steps in the production of a plug according to a conventional method.
Figure 1B:
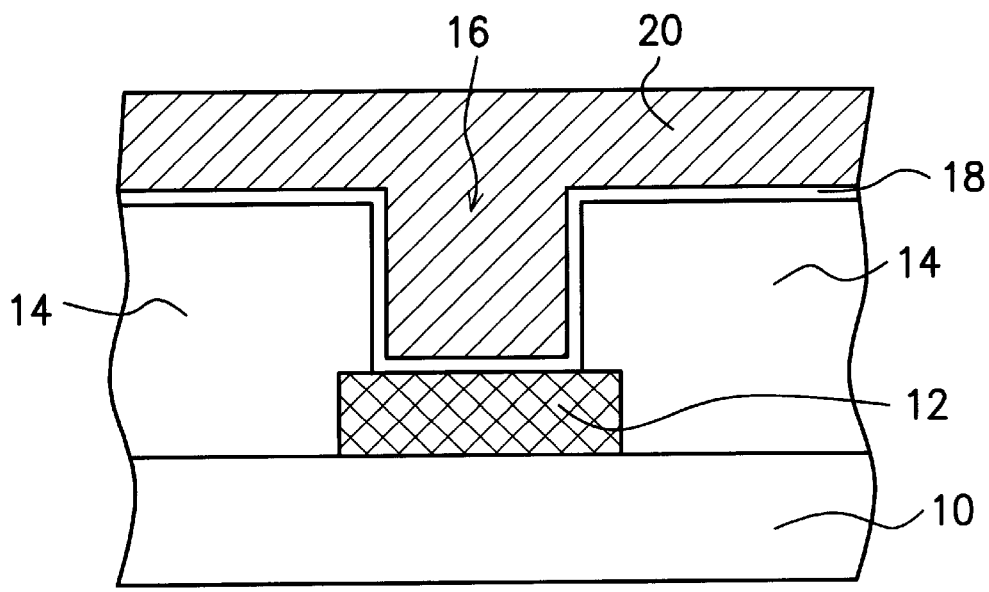

Reference will now be made in detail to the present preferred embodiments of the invention, examples of which are illustrated in the accompanying drawings. Wherever possible, the same reference numbers are used in the drawings and the description to refer to the same or like parts.

Figure 2A:
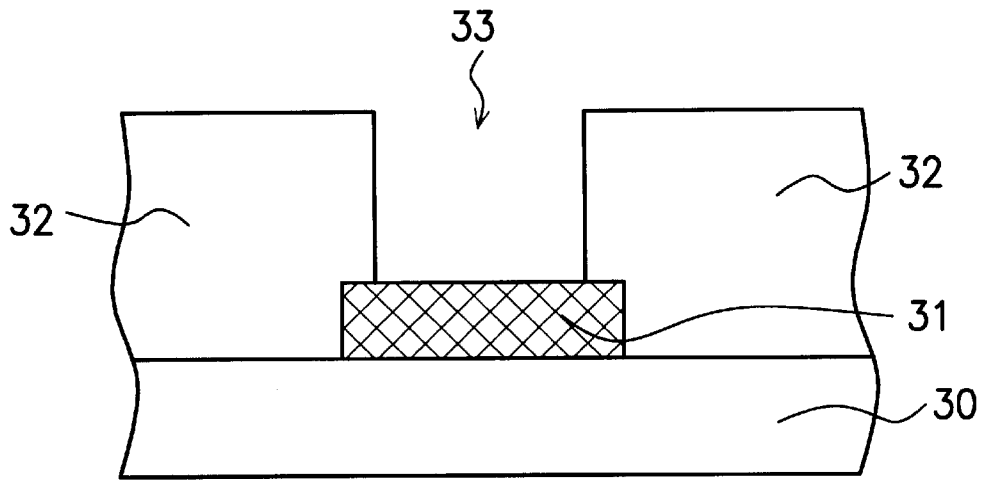
FIGS. 2A through 2E are cross-sectional views showing the progression of manufacturing steps in the production of a plug according to one preferred embodiment of this invention.

FIGS. 2A through 2E are cross-sectional views showing the progression of manufacturing steps in the production of a plug according to one preferred embodiment of this invention. First, as shown in FIG. 2A, a substrate 30 having a bottom metallic layer 31 already formed thereon is provided. The bottom metallic layer 31 is a region for connecting to other structures, and the material for the metallic layer can be an aluminum alloy, for example. Next, a dielectric layer 32 is formed over the substrate structures using a conventional chemical vapor deposition method. The dielectric layer is formed, for example, by depositing silicon dioxide. Thereafter, conventional photolithographic and etching processes are used to pattern the dielectric layer 32 forming an opening 33 that exposes the bottom metallic layer 31. In this embodiment, a bottom metallic layer 31 is chosen as an example. However, this invention need not restricted to just that. The opening 33 can also expose, for example, a source/drain region (not shown) in the substrate 30, where the source/drain region is a region for connecting to other structures.

Figure 2B:
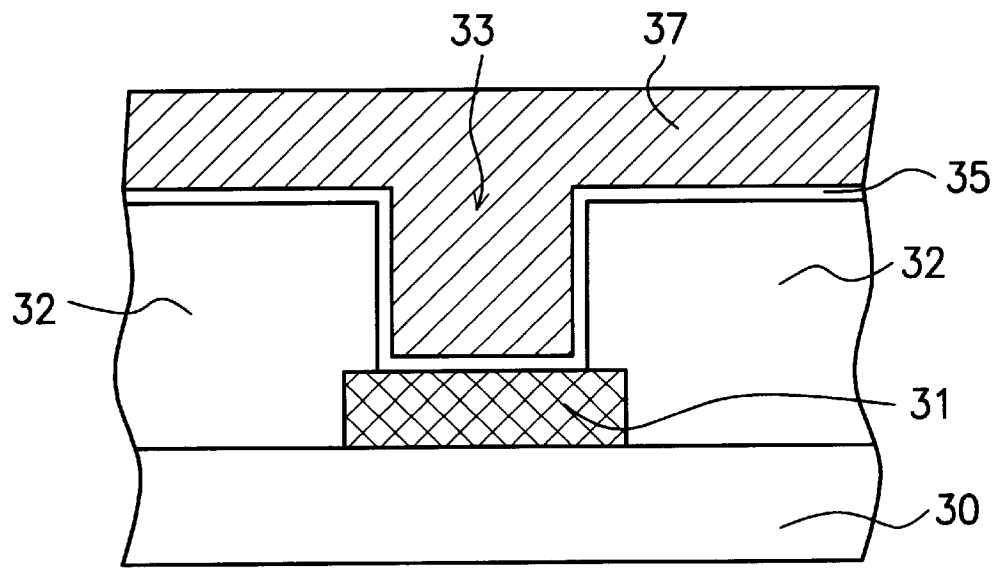

Next, as shown in FIG. 2B, a glue layer 35 is formed over the bottom metallic layer 31 of the opening 33, the dielectric sidewalls of the opening 33, and the dielectric layer 32 itself. The glue layer 35 serves to increase the adhesive strength of subsequently deposited plug material, as well as to act as an etching stop layer. The glue layer 35 can be a titanium/titanium nitride (Ti/TiN) composite layer, for example. The method of forming the glue layer 35 includes depositing a titanium layer over the bottom metallic layer 31, the dielectric sidewalls of the opening 33 and the dielectric layer 32, then performing a nitriding reaction, a chemical vapor deposition method, a IMP method or using a reactive sputtering method to deposit a layer of titanium nitride layer over the titanium layer. In a subsequent step, a chemical vapor deposition method is used to deposit plug material 37 over the glue layer 35 above the dielectric layer 32 and the opening 33. The plug material 37, for example, can be tungsten or aluminum.

Figure 1C:
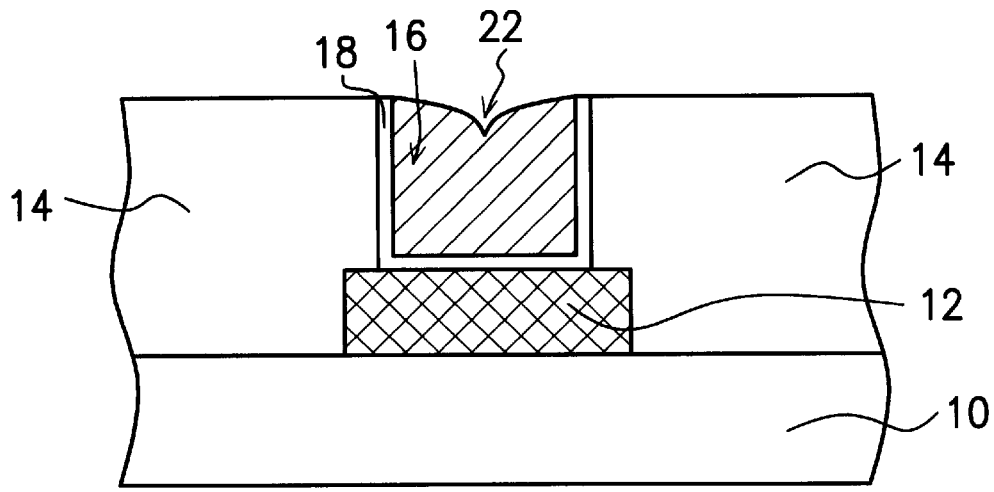
Figure 1D:
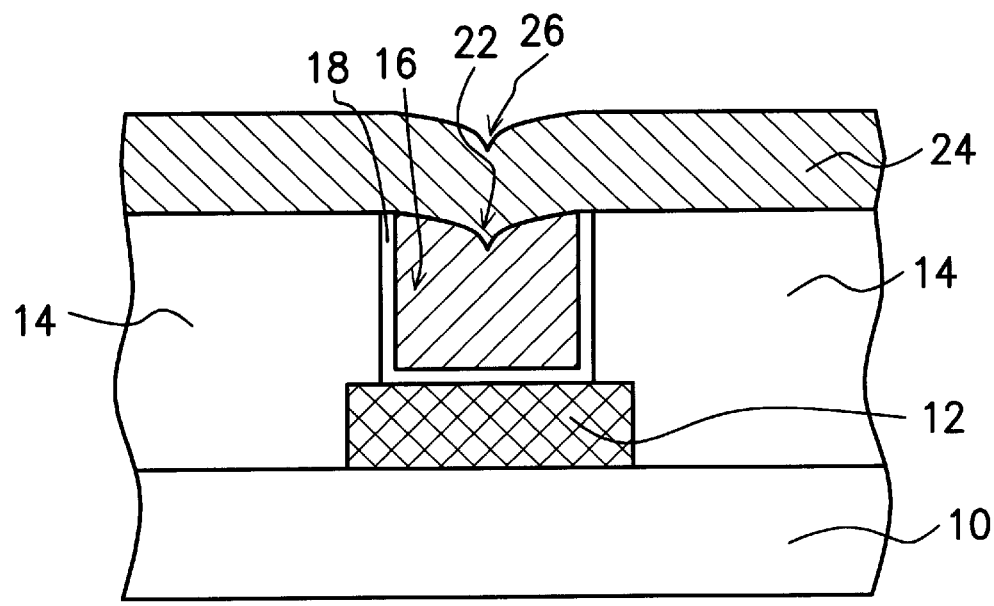
Figure 2C:
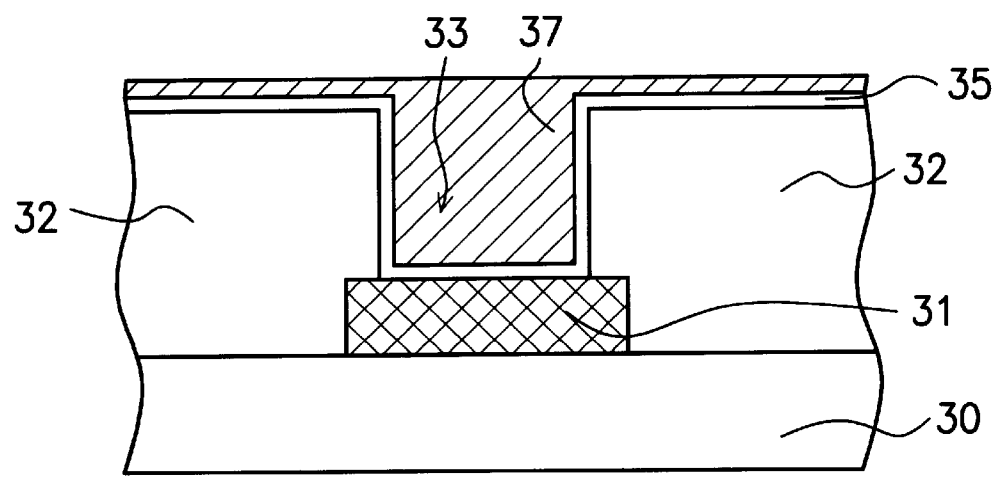

Next, as shown in FIG. 2C, an anisotropic etching back method is used to etch the plug material 37. The anisotropic etching back operation is very similar to the step as shown in FIG. 1C. The exception is that while the plug layer 20 is completely removed to expose the dielectric layer 24, in this invention, portions of the plug layer 37 is retained. The height level of the plug material 37 after the etching back is still higher than the glue layer 35 on top of the dielectric by about 200 Å to 500 Å. This serves to prevent the formation of recesses in subsequent etching operation.

Figure 2D:
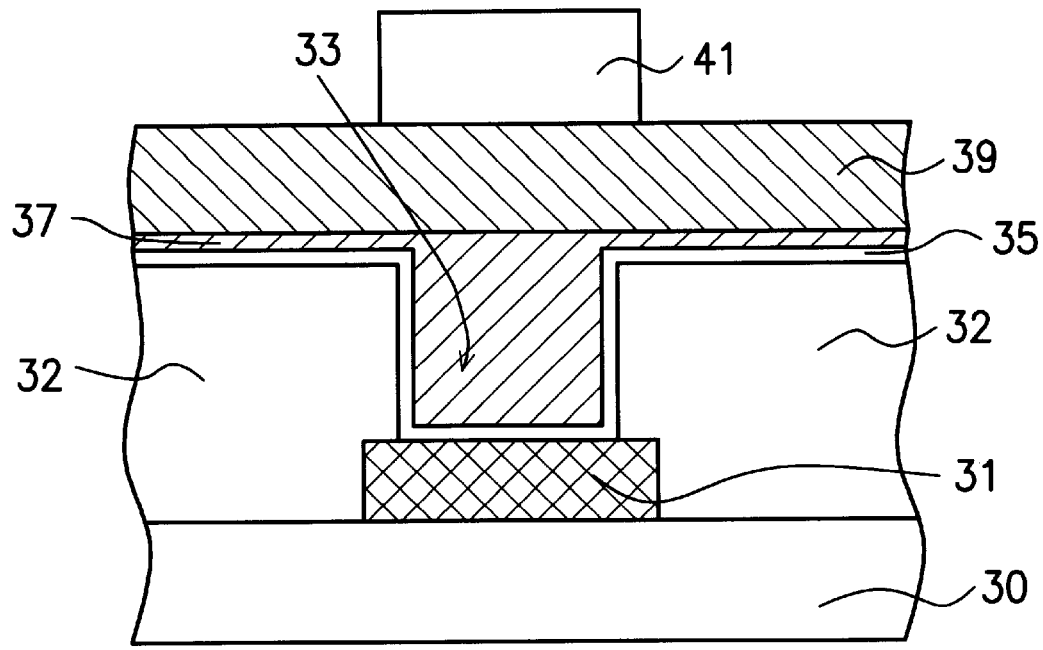

Next, as shown in FIG. 2D, a metallic layer 39 such as an aluminum alloy is formed over the plug layer 37, for example, using a chemical vapor deposition method. Then, a photoresist layer 41 exposing portions of the metallic layer 39 is formed over the substrate structure.

Figure 2E:
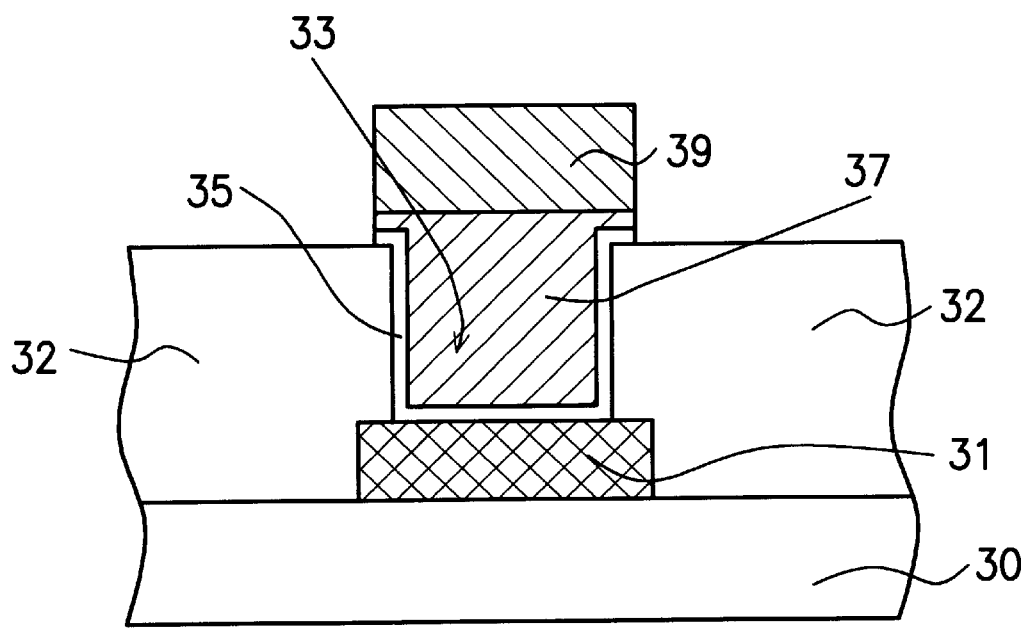

Next as shown in FIG. 2E, the exposed metallic layer 39 is etched, for example, using a dry etching method, then the remaining portion of the plug layer 37 is also etched using a secondary dry etching method to form a plug. The secondary dry etching uses the glue layer 35 as an etching stop layer so that the etching continues until the dielectric layer 32 is exposed. Finally, subsequent processes are performed such as the removal of photoresist layer 41.

The method used in forming the plug avoids etching back of the plug material in the plug opening. Hence, no recesses are formed in the opening 33. Furthermore, the plug layer 37 is also etched to form a plug along with the patterning of the metallic layer 39 in the same etching operation, thereby saving an etching step.

Therefore, the first characteristic of this invention is the retaining of a portion of the plug layer after a first etching. Hence, the etched plug is still above the glue layer by about 200 Å to 500 Å. Consequently, the formation of recesses on plug surface can be prevented, and there is no deterioration of electrical properties or a lowering of yield for the devices.

The second characteristic of this invention is the etching of the metallic layer and the plug layer to form the plug in the same etching operation using the same patterned photoresist layer. This saves an extra processing step.

The third characteristic is that no expensive chemical-mechanical polishing machinery is used. Therefore, the method of this invention is cost effective.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing plugs comprising the steps of:
   providing a substrate that has a dielectric layer already formed thereon, wherein the dielectric layer also has an opening that exposes a pad area above the substrate for connection with other structures;
   forming a glue layer over the pad area and the dielectric sidewalls of the opening, as well as the dielectric layer itself;
   forming a plug layer filling the opening and covering the glue layer that formed on top of the dielectric layer;
   etching back a portion of the plug layer such that the level of the etched plug layer falls to a level higher than the glue layer that formed on top of the dielectric layer;
   forming a metallic layer over the etched plug layer;
   coating a photoresist layer over the substrate such that a specified region of the metallic layer is exposed; and
   etching the exposed region of the metallic layer and the etched plug layer that lies above the dielectric layer until the surface of the dielectric layer is exposed, thereby turning the etched plug layer into a plug.

2. The method of claim 1, wherein the step of providing the substrate further includes the step of forming a bottom metallic layer over the substrate and the subsequent deposition of a dielectric layer over the bottom metallic layer.

3. The method of claim 2, wherein the pad area above the substrate for connection with other structures is a bottom metallic layer.

4. The method of claim 1, wherein the step of forming the plug layer includes depositing tungsten.

5. The method of claim 1, wherein the step of forming the plug layer includes depositing aluminum.

6. The method of claim 1, wherein the step of forming the dielectric layer includes depositing silicon dioxide.

7. The method of claim 1, wherein the step of forming the glue layer including depositing a titanium/titanium nitride composite layer.

8. The method of claim 1, wherein the step of forming the glue layer including depositing a titanium nitride layer.

9. The method of claim 1, wherein the step of forming the glue layer includes the substeps of:

depositing a titanium layer over the pad area for connection with other structures at the bottom of the opening, the dielectric sidewalls of the opening and the dielectric layer itself; and forming a titanium nitride layer over the surface of the titanium layer.

10. The method of claim 9, wherein the step of forming the titanium nitride layer includes using a reactive sputtering method.

11. The method of claim 9, wherein the step of forming the titanium nitride layer includes using a IMP method.

12. The method of claim 9, wherein the step of forming the titanium nitride layer includes using a nitriding method.

13. The method of claim 9, wherein the step of forming the titanium nitride layer includes using a chemical vapor deposition.

14. The method of claim 1, wherein the step of forming the plug layer includes using a chemical vapor deposition method.

15. The method of claim 1, wherein the step of etching back the plug layer includes using a dry etching method.

16. The method of claim 1, wherein the step of etching back the plug layer includes etching the plug layer to a level higher than the glue layer that has already formed on top of the dielectric layer by about 200 Å to 500 Å.

17. The method of claim 1, wherein the step of forming the metallic layer includes using a chemical vapor deposition method.

18. The method of claim 1, wherein the step of forming the bottom metallic layer includes depositing aluminum alloy.

19. The method of claim 1, wherein the step of forming the metallic layer includes depositing aluminum alloy.

* * * * *